US009299601B2

United States Patent
Li

(10) Patent No.: US 9,299,601 B2
(45) Date of Patent: Mar. 29, 2016

(54) SOI RF DEVICE AND METHOD FOR FORMING THE SAME

(71) Applicant: Shanghai Huahong Grace Semiconductor Manufacturing Corporation, Shanghai (CN)

(72) Inventor: Ernest Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/160,075

(22) Filed: Jan. 21, 2014

(65) Prior Publication Data

US 2014/0210038 A1    Jul. 31, 2014

(30) Foreign Application Priority Data

Jan. 28, 2013  (CN) .......................... 2013 1 0032589

(51) Int. Cl.
  *H01L 21/84*   (2006.01)
  *H01L 21/762*  (2006.01)
  *H01L 27/12*   (2006.01)

(52) U.S. Cl.
  CPC .......... *H01L 21/76283* (2013.01); *H01L 21/84* (2013.01); *H01L 27/1203* (2013.01)

(58) Field of Classification Search
  CPC . H01L 21/76; H01L 21/762; H01L 21/76254; H01L 21/76275; H01L 29/02; H01L 29/06; H01L 29/066; H01L 29/0649; H01L 29/0739
  USPC .................... 257/328, 329, 506, 507, E29.02; 438/384–404, 415, 565
  See application file for complete search history.

(56) References Cited

U.S. PATENT DOCUMENTS

| 6,890,804 | B1 * | 5/2005 | Shibib et al. | 438/163 |
| 8,110,464 | B2 * | 2/2012 | Dyer et al. | 438/243 |
| 2003/0094649 | A1 * | 5/2003 | Hueting et al. | 257/328 |
| 2004/0002197 | A1 * | 1/2004 | Fathimulla et al. | 438/455 |
| 2008/0217727 | A1 * | 9/2008 | Kjar | 257/499 |
| 2012/0068276 | A1 | 3/2012 | Lin et al. | |
| 2013/0341754 | A1 * | 12/2013 | Doris et al. | 257/506 |
| 2014/0175598 | A1 * | 6/2014 | Li et al. | 257/507 |
| 2014/0217503 | A1 * | 8/2014 | Zhong et al. | 257/347 |
| 2014/0357051 | A1 * | 12/2014 | Li | 438/458 |

OTHER PUBLICATIONS

First Chinese Office Action regarding Application No. 201310032589.9 dated Dec. 29, 2015. English translation provided by Unitalen Attorneys at Law.

* cited by examiner

*Primary Examiner* — Michael Lebentritt
(74) *Attorney, Agent, or Firm* — Harness, Dickey & Pierce, P.L.C.

(57) ABSTRACT

A SOI RF device and a method for forming the same are provided. A trench exposed a part of the high resistivity silicon base is formed in the SOI substrate; a non-doped polysilicon layer is disposed on the high resistivity silicon base which is exposed by the trench; and at least a part of the non-doped polysilicon layer is covered by an above metal layer. With effects of the metal layer which is applied with a RF signal or a superposed signal, and fixed charges in the BOX layer, an inversion layer may be formed at a surface of the non-doped polysilicon layer. Since carriers may easily recombine at the grain boundaries of polysilicon, eddy current generated on a surface of the high resistivity silicon base is reduced, loss of the RF signal is reduced, and linearity of the RF signal device is improved.

21 Claims, 5 Drawing Sheets

SOI RF DEVICE AND METHOD FOR FORMING THE SAME

CROSS-REFERENCE TO RELATED APPLICATIONS

The present application claims priority to Chinese patent application No. 201310032589.9, filed on Jan. 28, 2013, and entitled "SOT RF DEVICE AND METHOD FOR FORMING THE SAME", the entire disclosure of which is incorporated herein by reference.

TECHNICAL FIELD

The present disclosure generally relates to semiconductor manufacture technology, and more particularly, to a Silicon on Insulator (SOT) Radio Frequency (RF) device and a method for forming the same.

BACKGROUND

Semiconductor devices are developing to have high integration, high operation speed and low power consumption, which limit the application of bulk silicon substrates. On the contrary, Silicon on Insulator (SOT) substrates have advantages of dielectric isolation of devices in integrated circuit, complete elimination of parasitic latch-up effect in COMS circuit on bulk silicon substrate, low parasitic capacitance, high integration density, high speed, simple process, small short-channel effect, and applicability for low-power and low-voltage circuits. Therefore, SOT substrates are used more and more widely to form semiconductor devices. Radio Frequency (RF) devices require a small parasitic capacitance, in which substrate parasitic capacitance often plays a significant role. The parasitic capacitance can be effectively reduced by adopting a SOT substrate. In addition, high frequency characteristics and operating speed of RF devices may be improved when the RF devices are fabricated on SOT substrate.

A schematic structural diagram of a SOI RF device in the prior art is illustrated in FIG. 1. Referring to FIG. 1, a SOI substrate 1 includes a high resistivity silicon base 2, a Buried Oxide (BOX) layer 3 on the high resistivity silicon base 2, and a top silicon layer 4 on the BOX layer 3. A shallow trench isolation structure 5 is formed in the top silicon layer 4, so as to isolate active areas (not shown) in the top silicon layer 4. Semiconductor devices, such as transistors, are formed in the active areas of the top silicon layer 4. Metal interconnection structures are formed on the SOI substrate 1. As shown in FIG. 1, taking one layer Metal interconnection structure as an example, the one layer Metal interconnection structure includes: an interlayer dielectric layer 6 on the top silicon layer 4 and the shallow trench isolation structure 5, conductive plugs (not shown) formed in the interlayer dielectric layer 6, and a metal layer 7 on the interlayer dielectric layer 6 and the conductive plugs, where at least a part of the shallow trench isolation structure 5 is covered by the metal layer 7.

However, it is found in actual application that, the SOI RF device has disadvantages of great loss and poor linearity of RF signals in some RF applications requiring high linearity and low insertion loss.

SUMMARY

The present disclosure aims to solve the problems of great loss and poor linearity of RF signals in some RF applications requiring high linearity and low insertion loss.

Inventors of the present disclosure found reasons which result in the great loss and poor linearity of RF signals in some RF applications requiring high linearity and low insertion loss. When an external circuit applies a RF signal or a signal superposed by a RF signal and a direct current signal on the SOI RF device, the signal may transmit in the metal interconnection structure. As shown in FIG. 1, since the high resistivity silicon base 2 has a low dopant concentration, an inversion layer 8 may be formed at a surface, which is near the BOX layer 3, of the high resistivity silicon base 2, with effects of the metal layer 7 applied with the signal, and fixed charges in the BOX layer 3, which results in a surface resistance decrease of the high resistivity silicon base 2, and a conductivity increase of the high resistivity silicon base 2. In this case, a capacitance C may be regarded as forming by the metal layer 7, the high resistivity silicon base 2 just below the metal layer 7, the interlayer dielectric layer 6 between the metal layer 7 and the high resistivity silicon base 2, and the shallow trench isolation structure 5. In the capacitance C, the metal layer 7 and the high resistivity silicon base 2 may be regarded as two plates of the capacitance C, and the interlayer dielectric layer 6 and the shallow trench isolation structure 5 may be regarded as a dielectric layer between the two plates of the capacitance C. Since the metal layer 7 is applied with a RF signal or a signal superposed by a RF signal and a direct current signal, and the RF signal is changing with time, the signal can be coupled to the high resistivity silicon base 2 through the capacitance C. A current eddy current may be formed on a surface of the high resistivity silicon base 2 by an electromagnetic field generated by the RF signal, which may result in a loss of RF signal and a poor linearity of RF signal.

In order to solve the problems mentioned above, a SOI RF device is provided in embodiments of the disclosure. The device may include: a SOI substrate, which includes a high resistivity silicon base, a top silicon layer and a Buried Oxide (BOX) layer disposed between the high resistivity silicon base and the top silicon layer, where two or more active areas are disposed in the top silicon layer, each two adjacent active areas are insulated by a trench formed in the SOI substrate, the trench exposes a part of the high resistivity silicon base, the part of the high resistivity silicon base exposed by the trench is covered by a non-doped polysilicon layer which contacts the high resistivity silicon base, a part of the trench which is not filled with the non-doped polysilicon layer is filled with an insulation layer, and the insulation layer insulates the top silicon layer and the non-doped polysilicon layer; and a plurality of metal interconnection structures formed on the top silicon layer and the insulation layer, where each of the plurality of metal interconnection structures includes an interlayer dielectric layer formed on the top silicon layer and the insulation layer, and a metal layer formed on the interlayer dielectric layer, and at least a part of the non-doped polysilicon layer is covered by the metal layer.

In some embodiments, the trench may further expose a part of the BOX layer, a part of the insulation layer covers the BOX layer exposed by the trench, and the rest part of the insulation layer covers the non-doped polysilicon layer.

In some embodiments, the trench may further expose a part of the BOX layer, and the entire insulation layer covers the BOX layer exposed by the trench.

In some embodiments, material of the insulation layer may include silicon oxide.

In some embodiments, a bottom wall of the trench may be disposed in the high resistivity silicon base.

According to embodiments of the present disclosure, a method for forming a SOI RF device is provided. The method may include: providing a SOI substrate, where the SOI substrate includes a high resistivity silicon base, a top silicon layer and a Buried Oxide (BOX) layer disposed between the high resistivity silicon base and the top silicon layer; forming a first trench to expose a part of the BOX layer in the SOI substrate, filling the first trench to form an insulation layer, forming a second trench to expose a part of the high resistivity silicon base in the insulation layer, and filling the second trench to form a non-doped polysilicon layer, where a remaining part of the insulation layer insulates the top silicon layer and the non-doped polysilicon layer; and forming a plurality of metal interconnection structures on the top silicon layer, the insulation layer and the non-doped polysilicon layer, where each of the plurality of metal interconnection structures includes an interlayer dielectric layer formed on the top silicon layer, the insulation layer and the non-doped polysilicon layer, and a metal layer on the interlayer dielectric layer.

In some embodiments, forming a first trench to expose a part of the BOX layer in the SOI substrate, filling the first trench to form an insulation layer, forming a second trench to expose a part of the high resistivity silicon base in the insulation layer, and filling the second trench to form a non-doped polysilicon layer may include: forming a pad oxide layer on the top silicon layer, and a mask layer on the pad oxide layer; forming a first patterned photoresist layer on the mask layer, and performing an etching process by employing the first patterned photoresist layer as a mask, to form a patterned mask layer, a patterned pad oxide layer, and a first trench to expose a part of the BOX layer in the SOI substrate; removing the first patterned photoresist layer, forming an insulation layer on the patterned mask layer and in the first trench, and performing a Chemical Mechanical Polishing (CMP) process to remove a part of the insulation layer beyond a surface of the patterned mask layer; after the CMP process, forming a second patterned photoresist layer on the patterned mask layer and the insulation layer, and performing an etching process by employing the second patterned photoresist layer as a mask, to form a second trench which exposes a part of the high resistivity silicon base in the insulation layer, where a part of the insulation layer remains on the BOX layer exposed by the first trench; removing the remaining second patterned photoresist layer, and forming a non-doped polysilicon layer on the patterned mask layer, the insulation layer and the high resistivity silicon base exposed by the second trench; performing a CMP process to remove a part of the non-doped polysilicon layer beyond the surface of the patterned mask layer; and removing the patterned mask layer, the patterned pad oxide layer and a part of the non-doped polysilicon layer beyond a surface of the top silicon layer.

In some embodiments, material of the mask layer may include silicon nitride.

In some embodiments, material of the insulation layer may include silicon nitride.

In some embodiments, a bottom wall of the second trench may be disposed in the high resistivity silicon base.

In some embodiments, the method may further include: before forming an interlayer dielectric layer on the top silicon layer, the insulation layer and the non-doped polysilicon layer, forming two or more active areas in the top silicon layer, where each two adjacent active areas are insulated by the first trench.

Compared with the prior art, the present disclosure has the following advantages: in the SOI RF device, a trench exposed a part of the high resistivity silicon base is formed in the SOI substrate, a non-doped polysilicon layer is disposed on the high resistivity silicon base which is exposed by the trench, where the non-doped polysilicon layer directly contacts the high resistivity silicon base, and at least a part of the non-doped polysilicon layer is covered by the above metal layer. Therefore, with effects of the metal layer which is applied with a RF signal or a signal superposed by a RF signal or a direct current signal, and fixed charges in the BOX layer, inversion layer may not be formed at a surface, which is near the non-doped polysilicon layer, of the high resistivity silicon base. On the contrary, an inversion layer may be formed at a surface, which contacts the high resistivity silicon base, of the non-doped polysilicon layer. Since carriers may easily recombine at the grain boundaries of polysilicon, the carrier density is low in an inversion layer of the non-doped polysilicon layer. Therefore, surface resistance decrease of the high resistivity silicon base may be suppressed, and high resistivity of the high resistivity silicon base can be effectively maintained, so that eddy current generated on a surface of the high resistivity silicon base is reduced, loss of the RF signal is reduced, and linearity of the RF signal of SOI RF device is improved.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Embodiment 1

Figure 1:
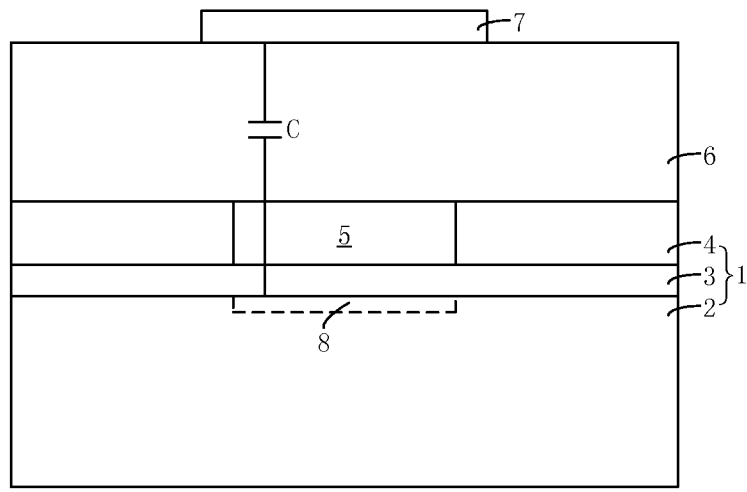
FIG. 1 schematically illustrates a cross-sectional view of a SOI RF device in the prior art.
Figure 2:
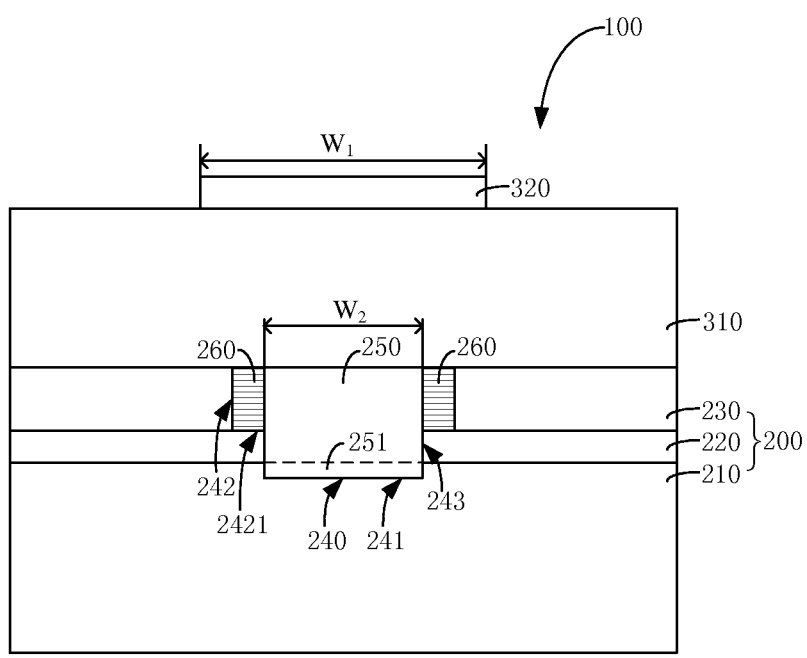
FIG. 2 schematically illustrates a cross-sectional view of a SOI RF device according to a first embodiment of the present disclosure.

FIG. 2 schematically illustrates a cross-sectional view of a SOI RF device according to a first embodiment of the present disclosure. As shown in FIG. 2, the SOI RF device includes a SOI substrate 200 and a metal interconnection structure on the SOI substrate 200. A plurality of semiconductor devices are formed in the SOI substrate 200. The metal interconnection structure can connect the plurality of semiconductor device to form a required circuit.

Specifically, the SOI substrate 200 includes a high resistivity silicon base 210, a top silicon layer 230 and a Buried Oxide (BOX) layer 220 disposed between the high resistivity silicon base 210 and the top silicon layer 230, wherein the high resistivity silicon base 210 provides a mechanical support to the BOX layer 220 and the top silicon layer 230, and a resistivity of the high resistivity silicon base 210 is greater than 200 $\Omega \cdot cm$. The top silicon layer 230 is used for forming semiconductor devices required by a circuit. Two or more active areas (not shown) are formed in the top silicon layer. A plurality of types of semiconductor devices, such as PN junction diodes, bipolar transistors (BJT), Schottky diodes, field effect transistors, etc, are formed in the active areas. Each two adjacent active areas are isolated by a trench 240 formed in the SOI substrate 200. The trench 240 exposes not only a part of the BOX layer 220 but also a part of the high resistivity silicon base 210. An opening of the trench 240 is disposed on a surface of the top silicon layer 230. A bottom wall 241 of the trench 240 may be disposed at an interface of the BOX layer 220 and the high resistivity silicon base 210, or in the high resistivity silicon base 210 (in this case, the bottom wall 241 is lower than the interface of the BOX layer 220 and the high resistivity silicon base 210). The trench 230 may be regarded as a combination of a first trench 242 and a second trench 243 interconnected with the first trench 242, where the first trench 242 is above the second trench 243, and a width of the first trench 242 is greater than a width of the second trench 243, so as to expose not only a part of the high resistivity silicon base 210 but also a part of the BOX layer 220. A bottom wall 2421 of the first trench 242 is disposed at an interface of the top silicon layer 230 and the BOX layer 220, so as to expose a part of the BOX layer 220, and a sidewall (not shown) of the first trench 242 is disposed in the top silicon layer 230. A bottom wall of the second trench 243 is the bottom wall 241 of the trench 240. If the bottom wall of the second trench 243 is disposed at the interface the BOX layer 220 and the high resistivity silicon base 210, a sidewall (not shown) of the second trench 243 is disposed in the BOX layer 220; if the bottom wall of the second trench 243 is disposed in the high resistivity silicon base 210, the sidewall (not shown) of the second trench 243 is disposed in the BOX layer 220 and the high resistivity silicon base 210.

The part of the high resistivity silicon base 210, which is exposed by the trench 240, is covered by a non-doped polysilicon layer 250, and the non-doped polysilicon layer 250 directly contacts the high resistivity silicon base 210. The second trench 243 is filled with the non-doped polysilicon layer 250. A part of the trench 240, which is not filled with the non-doped polysilicon layer 250, is filled with an insulation layer 260. Namely, the above of the BOX layer 220, which is exposed by the trench 240, is filled with the insulation layer 260. The insulation layer 260 insulates the top silicon layer 230 and the non-doped polysilicon layer 250, so as to prevent a contact of the top silicon layer 230 and the non-doped polysilicon layer 250. In this embodiment, the non-doped polysilicon layer 250 is not covered by the insulation layer 260.

A layer number of the metal interconnection structures formed on the SOI substrate 200 may be one or more. In this disclosure, one layer metal interconnection structure is taken as an example. The metal interconnection structure includes: an interlayer dielectric layer 310 formed on the top silicon layer 230, the insulation layer 260 and the non-doped polysilicon layer 250, and a metal layer 320 formed on the interlayer dielectric layer 310, where the metal layer 320 or a part of the metal layer 320 is disposed just above the non-doped polysilicon layer 250, and at least a part of the non-doped polysilicon layer 250 is covered by the above metal layer 320.

In above embodiments of the SOI RF device, material of the insulation layer 260 includes silicon oxide.

A RF signal or a signal superposed by a RF signal or a direct current signal, from an external circuit, may be applied on the SOI RF device in operation process. Therefore, the metal layer 320 may be applied with the RF signal or the superposed signal. With effects of the metal layer 320 applied with the signal, and positive charges in the BOX layer 220, inversion layer may not be formed at a surface, which is near the non-doped polysilicon layer 250, of the high resistivity silicon base 210. On the contrary, an inversion layer may be formed at a surface, which contacts the high resistivity silicon base 210, of the non-doped polysilicon layer 250. Since carriers may easily recombine at the grain boundaries of polysilicon, the carriers' lifetime is short in the non-doped polysilicon layer 250, and the carrier density is low in an inversion layer 251 of the non-doped polysilicon layer 250. Therefore, surface resistance decrease of the high resistivity silicon base 210 may be suppressed, and high resistivity of the high resistivity silicon base 210 can be effectively maintained, so that eddy current generated on surface of the high resistivity silicon base 210 is reduced, loss of the RF signal is reduced, and linearity of the RF signal is improved. It should be noted that, a thickness of the non-doped polysilicon layer 250 should be greater than a thickness of the inversion layer 251 in the non-doped polysilicon layer 250, so as to achieve the purpose for suppressing the surface resistance decrease of the high resistivity silicon base 210.

As shown in above, a width of the first trench 242 and a width of the second trench 243 (namely, a width of the non-doped polysilicon layer 250) may be set based on a width $W_1$ of the metal layer 320. A width difference between the first trench 242 and the second trench 243 may be reduced as much as possible, so that the width $W_2$ of the non-doped polysilicon layer 250 may be as close as possible to the width $W_1$ of the metal layer 320. Therefore, the metal layer 320 can cover more parts of the non-doped polysilicon layer 250, so as to further reduce the eddy current generated in the high resistivity silicon base 210, and reduce loss of the RF signal.

It should be noted that, in some embodiments, the layer number of the metal interconnection structures may be two or more. In this case, the metal layer 320, which is just above the non-doped polysilicon layer 250 and covers a part or whole of the non-doped polysilicon layer 250, may be a metal layer of a first metal interconnection structure (a metal layer of a metal interconnection structure which is closest to the SOI substrate 200), or a metal layer of a metal interconnection structure which is above the first metal interconnection structure. According to specific situations, one of the metal interconnection structures is selected as a basis for setting widths of the first trench 242 and the second trench 243. Preferably, the first metal interconnection structure may be selected as the basis for setting widths of the first trench 242 and the second trench 243.

Embodiment 2

Figure 3:
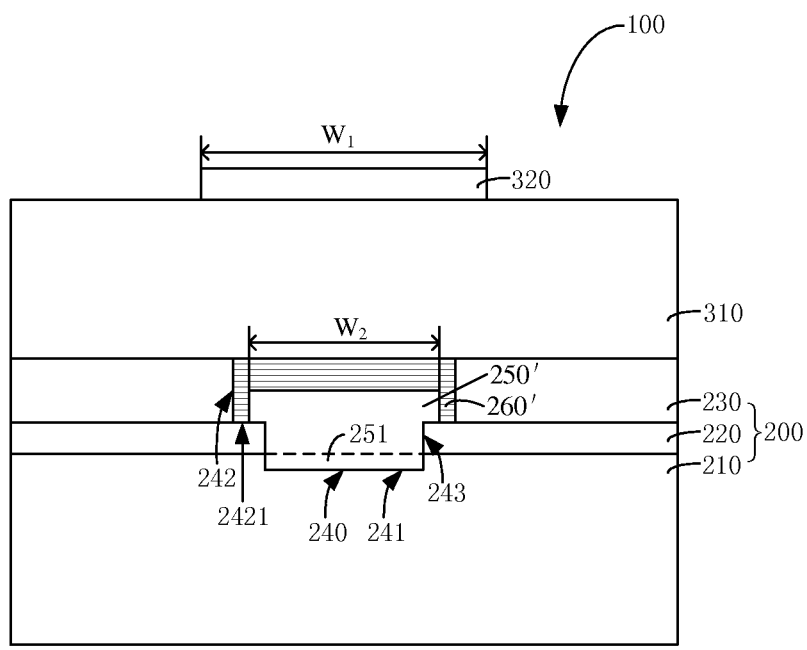
FIG. 3 schematically illustrates a cross-sectional view of a SOI RF device according to a second embodiment of the present disclosure.

FIG. 3 schematically illustrates a cross-sectional view of a SOI RF device according to a second embodiment of the present disclosure. The structure of the SOI RF device of the second embodiment may be described with reference to the first embodiment. Comparing FIG. 2 and FIG. 3, the difference of the SOI RF device in the second embodiment includes: the high resistivity silicon base 210, exposed by the trench 240, is covered by a non-doped polysilicon layer 250', where the non-doped polysilicon layer 250' contacts the high resistivity silicon base 210; a top surface of the non-doped polysilicon layer 250' (a surface far away from the high resistivity silicon base 210) is lower than a top surface of the top silicon layer 230; a part of the trench 240, which is not filled with the non-doped polysilicon layer 250', is filled with an insulation layer 260'; a part of the insulation layer 260' in the trench 240 covers the BOX layer 220 exposed by the trench 240; the rest part of the insulation layer 260' covers the non-doped polysilicon layer 250'; the insulation layer 260' insulates the top silicon layer 230 and the non-doped polysilicon layer 250', so as to prevent a contact of the top silicon layer 230 and the non-doped polysilicon layer 250'. In addition, the interlayer dielectric layer 310 in the metal interconnection structure is formed on the top silicon layer 230 and the insulation layer 260'.

As shown in the comparison, in the same fabrication conditions, a thickness of the non-doped polysilicon layer 250 in the first embodiment may be greater than a thickness of the non-doped polysilicon layer 250' in the second embodiment. Even so, it should be noted that, a thickness of the non-doped polysilicon layer 250' should be greater than a thickness of an inversion layer 251 generated in the non-doped polysilicon layer 250'.

It should be noted that, in the SOI RF devices of the present disclosure, the structure of the trench, which is filled with the non-doped polysilicon layer and the insulation layer, is not limited to the first embodiment, the second embodiment and the drawings. Any structure, which can cover the high resistivity silicon base exposed by the trench with a non-doped polysilicon layer, and insulate the top silicon layer and the non-doped polysilicon layer with an insulation layer to prevent a contact of the top silicon layer and the non-doped polysilicon layer, is possible. For example, in some embodiments, the insulation layer 260 or 260' may insert into the BOX layer 220 or even the high resistivity silicon base 220. Namely, the bottom edge of the insulation layer 260 or 260' need not be limited to the interface of the top silicon 230 and the BOX layer 220.

Although a plurality of structures of SOI RF device are disclosed above, the fabrication process of the SOI RF device in the first embodiment is simple and compatible with the conventional fabrication process. Therefore, a method for forming the SOI RF device in the first embodiment is provided. The method for forming the SOI RF device is described in conjunction with FIGS. 4-10.

First, step S1 is performed. The step S1 may include: providing a SOI substrate.

Figure 4:
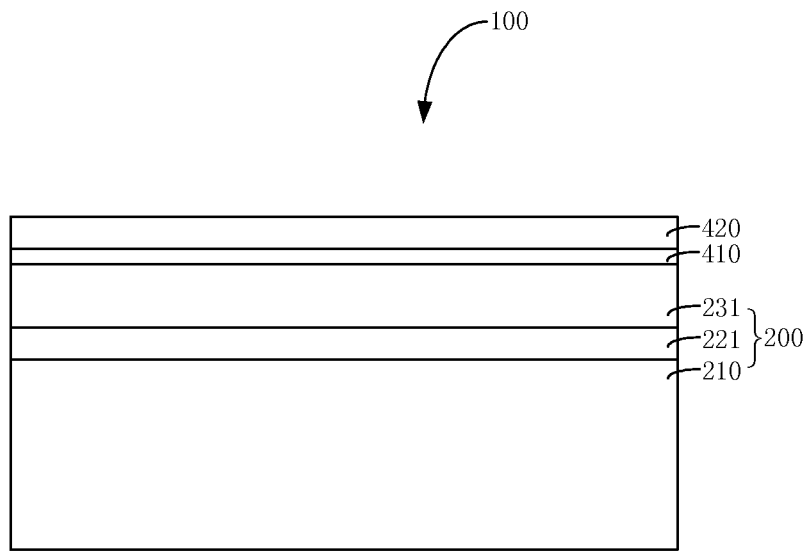
FIGS. 4-10 schematically illustrate intermediate structural diagrams of a method for forming a SOI RF device according to one embodiment of the present disclosure.

As shown in FIG. 4, the SOI substrate 200 includes a high resistivity silicon base 210, a top silicon layer 231 and a BOX layer 221 disposed between the high resistivity silicon base 210 and the top silicon layer 231.

Then step S2 is performed. The step S2 may include: forming a first trench to expose a part of the BOX layer in the SOI substrate; filling the first trench to form an insulation layer; forming a second trench to expose a part of the high resistivity silicon base in the insulation layer; and filling the second trench to form a non-doped polysilicon layer, where a remaining part of the insulation layer insulates the top silicon layer and the non-doped polysilicon layer.

Specifically, in one embodiment, the step S2 may include:

In step S21, referring to FIG. 4, a pad oxide layer 410 is formed on the top silicon layer 231, and a mask layer 420 is formed on the pad oxide layer 410.

In one embodiment, the pad oxide layer 410 may be formed by thermal oxidation method, and the mask layer 420 is formed by Chemical Vapor Deposition (CVD) method.

Figure 5:
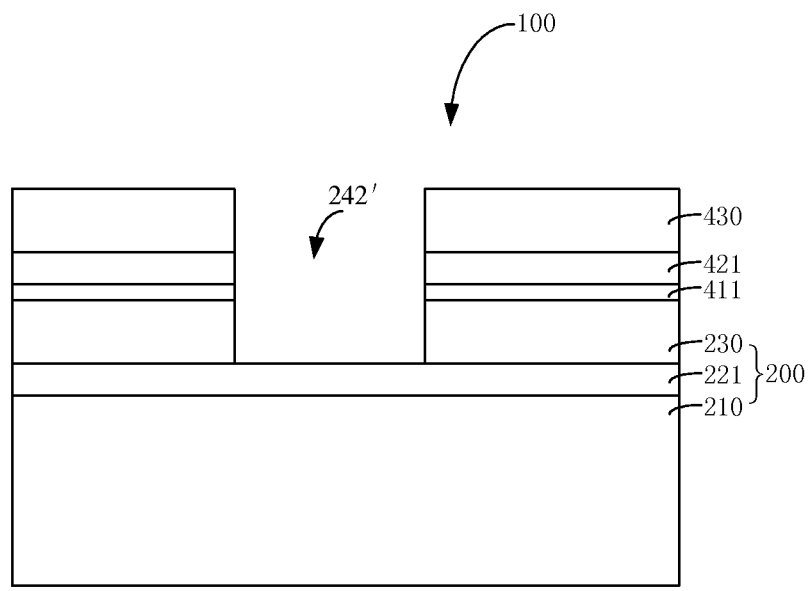

In step S22, referring to FIG. 4 and FIG. 5, a first patterned photoresist layer 430 is formed on the mask layer 420; and an etching process is performed by employing the first patterned photoresist layer 430 as a mask, to form a patterned mask layer 421, a patterned pad oxide layer 411, and a first trench 242' which exposes a part of the BOX layer 221 in the SOI substrate 200.

In one embodiment, dry etch is used to form the first trench 242'. A bottom wall of the first trench 242' is disposed at the interface of the BOX layer 221 and the top silicon layer 230. After the first trench 242' is formed, the top silicon layer 231 in FIG. 4 becomes a patterned top silicon layer, which is the top silicon 230 in FIG. 5.

Figure 6:
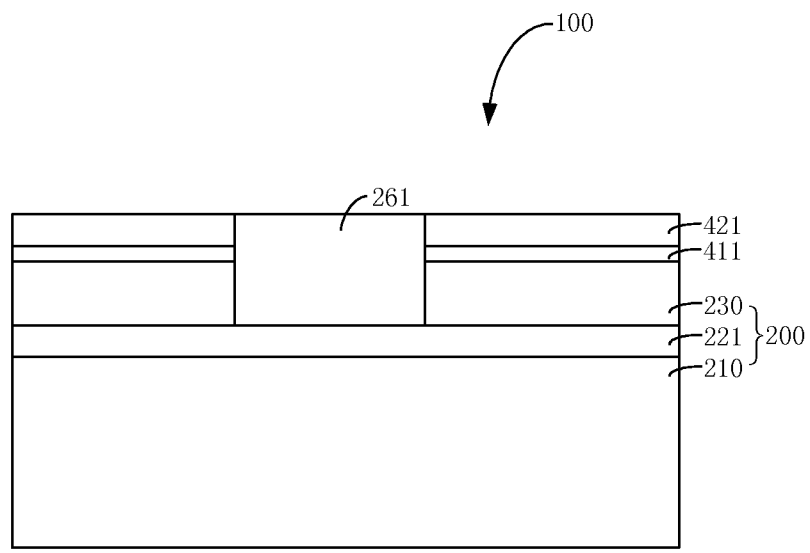

In step S23, as shown in FIG. 6, the first patterned photoresist layer 430 is removed; an insulation layer is formed on the patterned mask layer 421 and in the first trench 242' shown in FIG. 5; and a Chemical Mechanical Polishing (CMP) process is performed to remove a part of the insulation layer beyond a surface of the patterned mask layer 421.

In one embodiment, a CVD method may be used to form the insulation layer. After the CMP process, a part of the insulation layer on the surface of the patterned mask layer 421 is removed, and extra insulation layer outside of the first trench 242' in FIG. 5 is removed at the same time. A part of the insulation layer filling in the first trench 242' in FIG. 5 is the insulation layer 261.

Figure 7:
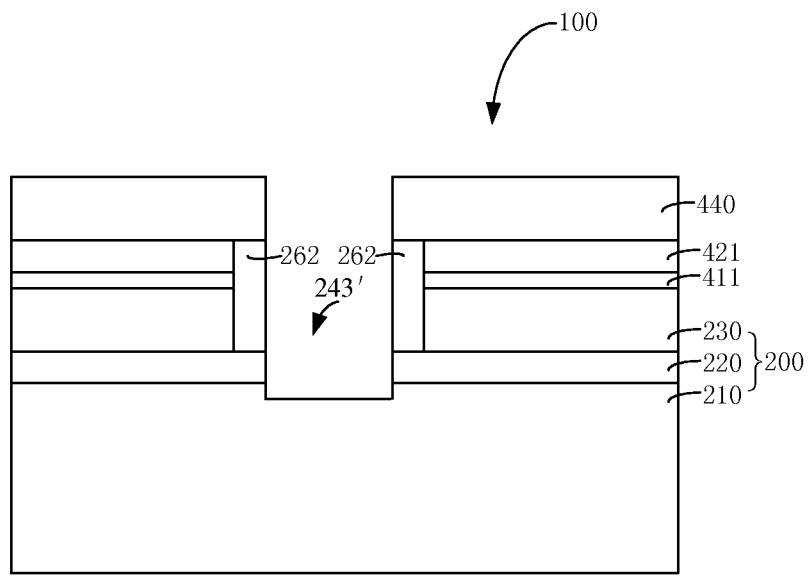

In step S24, as shown in FIG. 7, after the CMP process, a second patterned photoresist layer 440 is formed on the patterned mask layer 421 and the insulation layer 261 shown in FIG. 6, and an etching process is performed by employing the second patterned photoresist layer 440 as a mask, to form a second trench 243' which exposes a part of the high resistivity silicon base 210 in the insulation layer 261 shown in FIG. 6, where an insulation layer 262 is remaining on the BOX layer 220 exposed by the first trench 242'.

In one embodiment, dry etch is used to form the second trench 243'. A bottom wall of the second trench 243' may be disposed at the interface of the BOX layer 220 and the high resistivity silicon base 210. Namely, the etching process to form the second trench 243' is stopped at the interface of the BOX layer 220 and the high resistivity silicon base 210. The bottom wall of the second trench 243' may be disposed in the high resistivity silicon base 210. Namely, the etching process to form the second trench 243' is stopped in the high resistivity silicon base 210. If the etching process to form the second trench 243' is stopped at the interface of the BOX layer 220 and the high resistivity silicon base 210, a part of the BOX layer 220 may remain on a surface of the high resistivity silicon base 210. As a result, in the following process, when a non-doped polysilicon layer on the high resistivity silicon base 210 which is exposed by the second trench 243', the remaining BOX layer 220 may exist between the non-doped polysilicon layer and the high resistivity silicon base 210. Compared with a case that no BOX layer 220 exists between the non-doped polysilicon layer and the high resistivity silicon base 210, the remaining BOX layer 220 may reduce effective electrical contact between the high resistivity silicon base 210 and the non-doped polysilicon layer. In the most serious case, the high resistivity silicon base 210 and the non-doped polysilicon layer is isolated completely by the remaining BOX layer 220, which may result in an electrical open between the high resistivity silicon base 210 and the non-doped polysilicon layer, and a disappearance of the effect of the non-doped polysilicon layer to suppress the surface resistance decrease of the high resistivity silicon base 210. Therefore, in a preferably embodiment, over etching process is used to form the second trench 243'. Namely, the bottom wall of the second trench 243' is disposed in the high resistivity silicon base 210.

A width of the second trench 243' is smaller than a width the first trench 242' (as shown in FIG. 5). An insulation layer 262 is remaining on the BOX layer 220 exposed by the first trench 242'

Figure 8:
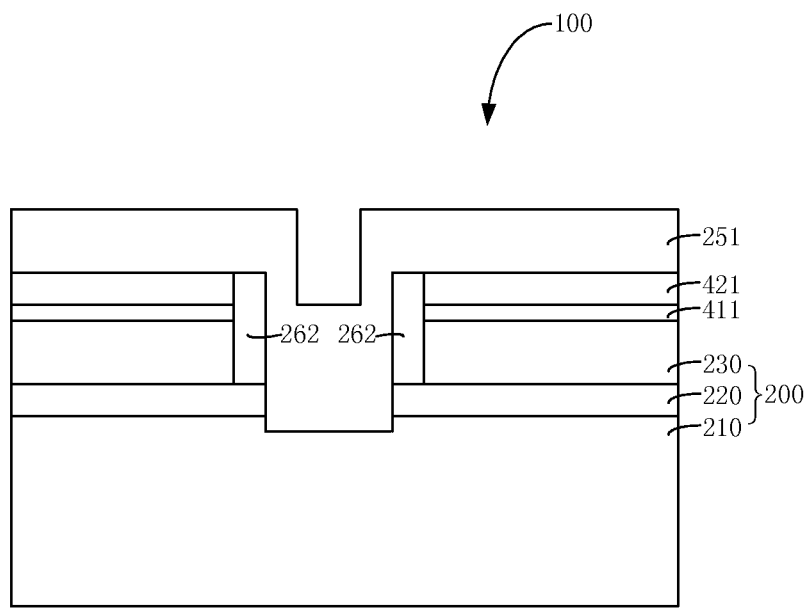

In step S25, as shown in FIG. 8, the remaining second patterned photoresist layer 440 is removed; and a non-doped polysilicon layer 251 is formed on the patterned mask layer 421, the insulation layer 262 and the high resistivity silicon base 210 exposed by the second trench 243' shown in FIG. 7.

In one embodiment, a CVD method may be used to form the non-doped polysilicon layer 251.

Figure 9:
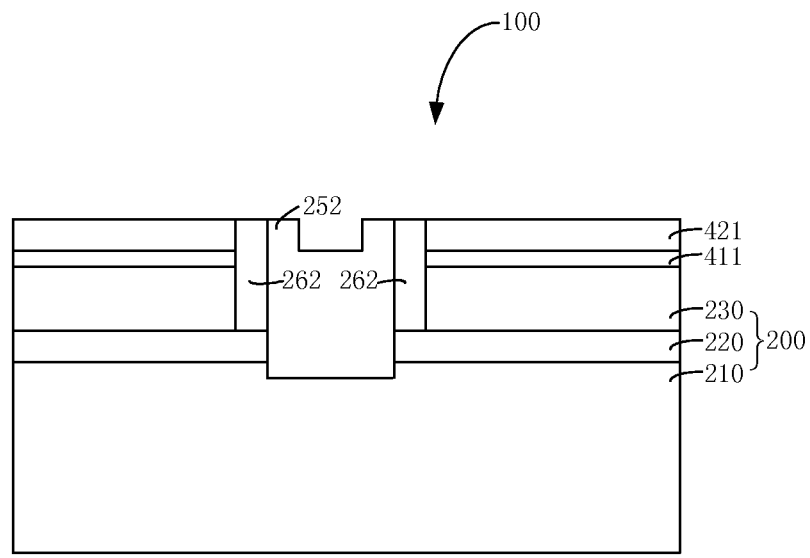

In step S26, as shown in FIG. 9, a CMP process is performed to remove a part of the non-doped polysilicon layer beyond the surface of the patterned mask layer 421.

After the CMP process, a part of the non-doped polysilicon layer on the surface of the patterned mask layer 421 is removed; and extra non-doped polysilicon layer outside of the second trench 243' shown in FIG. 7 is removed at the same time. A part of the non-doped polysilicon layer filling in the second trench 243' forms the non-doped polysilicon layer 252.

Figure 10:
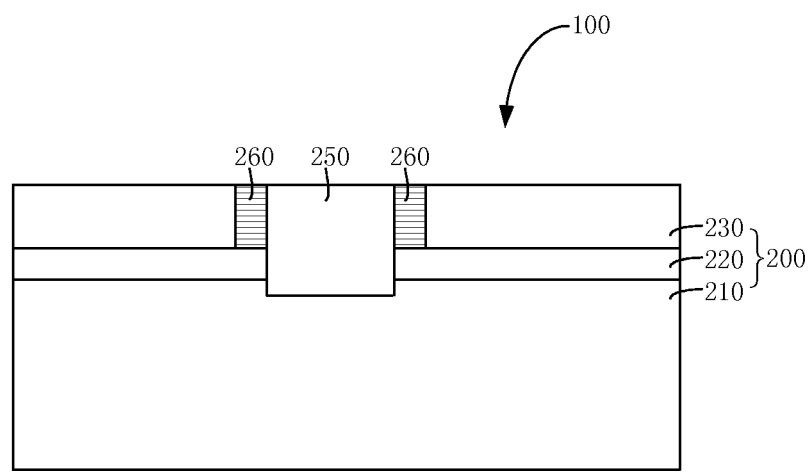

In step S27, as shown in FIG. 10, the patterned mask layer 421, the patterned pad oxide layer 411 and a part of the non-doped polysilicon layer beyond a surface of the top silicon layer 230, which are shown in FIG. 9, are removed.

After this step, a remaining part of the insulator layer forms the insulator 260; and a remaining part of the non-doped polysilicon layer forms the non-doped polysilicon layer 250. The insulation layer 260 insulates the top silicon layer 230 and the non-doped polysilicon layer 250, so as to a contact of the top silicon layer 230 and the non-doped polysilicon layer 250. The entire insulation layer 260 covers the BOX layer 220 exposed by the first trench 242'.

Then step S3 is performed. The step S3 may include: forming a plurality of metal interconnection structures on the top silicon layer, the insulation layer and the non-doped polysilicon layer, where each of the plurality of metal interconnection structures includes an interlayer dielectric layer formed on the top silicon layer, the insulation layer and the non-doped polysilicon layer and a metal layer on the interlayer dielectric layer.

As shown in FIG. 2, an interlayer dielectric layer 310 is formed on the top silicon layer 230, the insulation layer 260 and the non-doped polysilicon layer 250. Then a plurality of contact holes (not shown), which are filled with metal, are formed in the interlayer dielectric layer 310. Then a metal layer 320 is formed on the interlayer dielectric layer 310 and the contact holes. One or more layers of metal interconnection structure may be formed on the SOI substrate 200.

In above embodiments of the method for forming SOI RF device, material of the insulation layer may include silicon oxide. In addition, before the interlayer dielectric layer 310 is formed on the top silicon layer 230, the insulation layer 260 and the non-doped polysilicon layer 250, the method may further include a step for forming two or more active areas in the top silicon 230, where each two adjacent active areas are insulated by the first trench 242'.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A Silicon On Insulator (SOI) Radio Frequency (RF) device, comprising:
    a SOI substrate, which comprises a high resistivity silicon base, a top silicon layer and a Buried Oxide (BOX) layer disposed between the high resistivity silicon base and the top silicon layer, where two or more active areas are disposed in the top silicon layer, each two adjacent active areas are insulated by a trench formed in the SOI substrate, the trench exposes a part of the high resistivity silicon base, the part of the high resistivity silicon base exposed by the trench is covered by a non-doped polysilicon layer which contacts the high resistivity silicon base, a part of the trench which is not filled with the non-doped polysilicon layer is filled with an insulation layer, and the insulation layer insulates the top silicon layer and the non-doped polysilicon layer; and
    a plurality of metal interconnection structures formed on the top silicon layer and the insulation layer, where each of the plurality of metal interconnection structures comprises an interlayer dielectric layer formed on the top silicon layer and the insulation layer, and a metal layer formed on the interlayer dielectric layer, and at least a part of the non-doped polysilicon layer is covered by the metal layer.

2. The device according to claim 1, wherein the trench further exposes a part of the BOX layer, a part of the insulation layer covers the BOX layer exposed by the trench, and the rest part of the insulation layer covers the non-doped polysilicon layer.

3. The device according to claim 1, wherein the trench further exposes a part of the BOX layer, and the entire insulation layer covers the BOX layer exposed by the trench.

4. The device according to claim 1, wherein material of the insulation layer comprises silicon oxide.

5. The device according to claim 2, wherein material of the insulation layer comprises silicon oxide.

6. The device according to claim 3, wherein material of the insulation layer comprises silicon oxide.

7. The device according to claim 1, wherein a bottom wall of the trench is disposed in the high resistivity silicon base.

8. The device according to claim 2, wherein a bottom wall of the trench is disposed in the high resistivity silicon base.

9. The device according to claim 3, wherein a bottom wall of the trench is disposed in the high resistivity silicon base.

10. A method for forming a Silicon On Insulator (SOI) Radio Frequency (RF) device according to claim 1, comprising:
    providing a SOI substrate, where the SOI substrate comprises a high resistivity silicon base, a top silicon layer and a Buried Oxide (BOX) layer disposed between the high resistivity silicon base and the top silicon layer;
    forming a first trench to expose a part of the BOX layer in the SOI substrate, filling the first trench to form an insulation layer, forming a second trench to expose a part of the high resistivity silicon base in the insulation layer, and filling the second trench to form a non-doped polysilicon layer, where a remaining part of the insulation layer insulates the top silicon layer and the non-doped polysilicon layer; and
    forming a plurality of metal interconnection structures on the top silicon layer, the insulation layer and the non-doped polysilicon layer, where each of the plurality of metal interconnection structures comprises an interlayer dielectric layer formed on the top silicon layer, the insulation layer and the non-doped polysilicon layer, and a metal layer on the interlayer dielectric layer.

11. The method according to claim 10, wherein forming a first trench to expose a part of the BOX layer in the SOI substrate, filling the first trench to form an insulation layer, forming a second trench to expose a part of the high resistivity silicon base in the insulation layer, and filling the second trench to form a non-doped polysilicon layer comprise:
    forming a pad oxide layer on the top silicon layer, and a mask layer on the pad oxide layer;
    forming a first patterned photoresist layer on the mask layer, and performing an etching process by employing the first patterned photoresist layer as a mask, to form a patterned mask layer, a patterned pad oxide layer, and a first trench which exposes a part of the BOX layer in the SOI substrate;

removing the first patterned photoresist layer, forming an insulation layer on the patterned mask layer and in the first trench, and performing a Chemical Mechanical Polishing (CMP) process to remove a part of the insulation layer beyond a surface of the patterned mask layer;

after the CMP process, forming a second patterned photoresist layer on the patterned mask layer and the insulation layer, and performing an etching process by employing the second patterned photoresist layer as a mask, to form a second trench which exposes a part of the high resistivity silicon base in the insulation layer, where a part of the insulation layer remains on the BOX layer exposed by the first trench;

removing the remaining second patterned photoresist layer, and forming a non-doped polysilicon layer on the patterned mask layer, the insulation layer and the high resistivity silicon base exposed by the second trench;

performing a CMP process to remove a part of the non-doped polysilicon layer beyond the surface of the patterned mask layer; and removing the patterned mask layer, the patterned pad oxide layer and a part of the non-doped polysilicon layer beyond a surface of the top silicon layer.

12. The method according to claim 11, wherein material of the mask layer comprises silicon nitride.

13. The method according to claim 10, wherein material of the insulation layer comprises silicon nitride.

14. The method according to claim 11, wherein material of the insulation layer comprises silicon nitride.

15. The method according to claim 12, wherein material of the insulation layer comprises silicon nitride.

16. The method according to claim 10, wherein a bottom wall of the second trench is disposed in the high resistivity silicon base.

17. The method according to claim 11, wherein a bottom wall of the second trench is disposed in the high resistivity silicon base.

18. The method according to claim 12, wherein a bottom wall of the second trench is disposed in the high resistivity silicon base.

19. The method according to claim 10, further comprising: before forming an interlayer dielectric layer on the top silicon layer, the insulation layer and the non-doped polysilicon layer, forming two or more active areas in the top silicon layer, where each two adjacent active areas are insulated by the first trench.

20. The method according to claim 11, further comprising: before forming an interlayer dielectric layer on the top silicon layer, the insulation layer and the non-doped polysilicon layer, forming two or more active areas in the top silicon layer, where each two adjacent active areas are insulated by the first trench.

21. The method according to claim 12, further comprising: before forming an interlayer dielectric layer on the top silicon layer, the insulation layer and the non-doped polysilicon layer, forming two or more active areas in the top silicon layer, where each two adjacent active areas are insulated by the first trench.

* * * * *